Jan. 22, 1963

CHIAKI IZUMI ETAL

INPUT AND OUTPUT IMPEDANCE COMPENSATING CIRCUIT FOR TRANSISTOR AMPLIFIERS

Filed Jan. 11, 1960

3,075,152

Inventors
C. IZUMI
T. TOMIZAWA
By C. H. Suydam
AGENT

United States Patent Office 3,075,152

Patented Jan. 22, 1963

3,075,152

INPUT AND OUTPUT IMPEDANCE COMPENSATING CIRCUIT FOR TRANSISTOR AMPLIFIERS

Chiaki Izumi and Tadashi Tomizawa, Tokyo, Japan, assignors to Nippon Electric Company, Limited, Tokyo, Japan, a corporation of Japan Filed Jan. 11, 1960, Ser. No. 1,705
Claims priority, application Japan Jan. 14, 1959
1 Claim. (Cl. 330—24)

This invention relates to transistor amplifiers. More specifically it concerns circuit arrangements for improving the linear response of such amplifiers.

The main object of the invention is to improve the linear response of transistor amplifiers for low levels of signal input.

The above-mentioned object of this invention will become more apparent by reference to the following description taken in conjunction with the accompanying drawings, in which.

Figure 1:
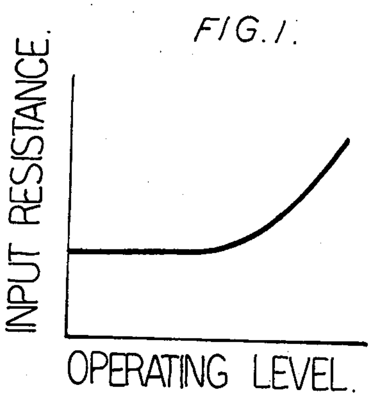
FIG. 1 shows a manner in which the input resistance value of a transistor varies with the signal input level.

It has been well known that the input or output impedance of a transistor is affected to a great extent by the bias condition. Furthermore, if the bias condition be maintained constant, its input or output impedance varies with the operating signal level or, more precisely, the carrier density. As an example, let the shunt resistance component of its input impedance be considered. As is indicated in FIG. 1, as the operating level increases gradually and exceeds a certain level the value of the input resistance increases rapidly. Therefore, if the transmission characteristics of an amplifier are determined by the resistance component of the input or output circuit of a transistor, as with an intermediate-frequency amplifier, the characteristics will vary with the operating level. This is the reason why use of transistors in high-performance communication equipment cannot satisfy its rigorous specification requirements.

Figure 2:
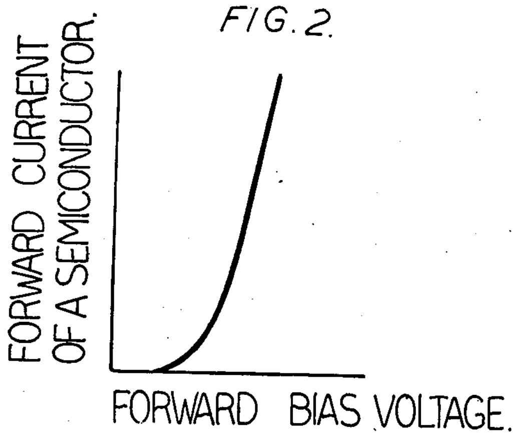
FIG. 2 shows the relationship between the forward bias voltage and the forward current of a semiconductor diode.
Figure 3:
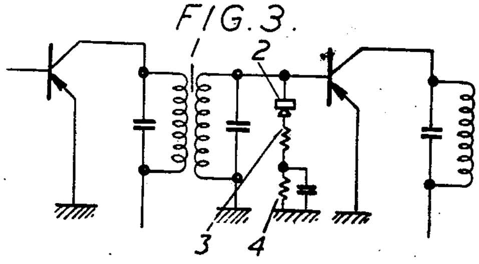
FIG. 3 shows the circuit construction for an embodiment of the present invention.

Referring to FIG. 3 there is shown two transistor amplifiers connected in cascade, the output of the first amplifier being coupled to the input of the second by the tuned circuits indicated by reference numeral 1. Across the tuned circuit connected to the input of the second transistor is connected a circuit which varies its impedance with the input signal level. This circuit consists of a semiconductor diode 2, a resistor 3 and an impedance network 4, the latter two members comprising a biasing circuit for the diode. The resistance value of resistor 3 is approximately the same as the input resistance value of the transistor when operating at a low signal value. As will be evident from FIG. 2 the impedance of diode 2 is comparatively high when the signal input level is low, whereas as the signal level rises and exceeds a certain value the impedance decreases rapidly. Therefore, the impedance of the circuit in which the diode 2 and the resistance 3 are connected will also be high while the signal input level is sufficiently low, whereas it will attain a lower and substantially constant value approximately equal to the valve of resistance 3 when the signal input level exceeds a certain level.

On the other hand, since the input resistance of a transistor varies with an increase of signal input level as shown in FIG. 1, the impedance as seen from the interstage coupling circuit looking toward the input of the transistor may be maintained substantially constant irrespective of the signal input level if the impedance decreasing point of the series circuit of diode 2 and resistance 3 is adjusted by the bias voltage developed across network 4 to compensate for the increasing input impedance of the transistor. As a result, the amplifier frequency-amplitude characteristics can also be maintained constant irrespective of the signal input level.

In a similar manner compensation for transistor input capacity can also be made by the use of a compound impedance in lieu of a series resistance 3. A similar method could be applied for the compensation of the output impedance.

While we have described above the principles of our invention in connection with specific apparatus, it is to be clearly understood that this description is made only by way of example and not as a limitation to the scope of our invention as set forth in the objects thereof and in the accompanying claim.

What is claimed is:

An impedance compensating circuit for a transistor amplifier having a transistor arranged in a common emitter configuration, the frequency-amplitude response of said amplifier being subject to undesired distortion caused by the variation of the input and output impedances of said transistor due to change in its operating signal level, the improvement therein comprising in series a semiconductor diode, a fixed impedance and a dynamic diode biasing circuit; said series being connected as a variable impedance in parallel with one of the input and output sides of said transistor, whereby the normal tendency of said transistor to vary its impedance in said one of said input and output sides is compensated by the change in impedance of said series circuit.

References Cited in the file of this patent

UNITED STATES PATENTS

| | | |
|---|---|---|
| 2,774,866 | Burger | Dec. 18, 1956 |
| 2,833,870 | Wilhelmsen | May 6, 1959 |
| 2,941,070 | Barry | June 14, 1960 |
| 2,943,266 | Belland | June 28, 1960 |
| 2,950,346 | Freedman | Aug. 23, 1960 |